(12) United States Patent
Weng

(10) Patent No.: US 11,329,045 B2
(45) Date of Patent: May 10, 2022

(54) FIELD EFFECT TRANSISTOR, METHOD FOR MAKING THE SAME AND LAYOUT IN PROCESS OF FORMING THE SAME

(71) Applicant: SHANGHAI HUALI INTEGRATED CIRCUIT CORPORATION, Shanghai (CN)

(72) Inventor: Wenyin Weng, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/118,428

(22) Filed: Dec. 10, 2020

(65) Prior Publication Data

US 2022/0045057 A1    Feb. 10, 2022

(30) Foreign Application Priority Data

Aug. 6, 2020 (CN) .......................... 202010780888.0

(51) Int. Cl.

| | |
|---|---|
| *H01L 29/76* | (2006.01) |
| *H01L 29/94* | (2006.01) |
| *H01L 27/092* | (2006.01) |
| *H01L 29/06* | (2006.01) |
| *H01L 21/8234* | (2006.01) |
| *H01L 29/78* | (2006.01) |
| *H01L 29/66* | (2006.01) |
| *H01L 29/417* | (2006.01) |

(52) U.S. Cl.
CPC .. *H01L 27/0924* (2013.01); *H01L 21/823431* (2013.01); *H01L 29/0649* (2013.01); *H01L 29/41791* (2013.01); *H01L 29/66795* (2013.01); *H01L 29/7851* (2013.01)

(58) Field of Classification Search
CPC ......... H01L 27/0924; H01L 21/823431; H01L 29/0649; H01L 29/41791; H01L 29/66795; H01L 29/7851
USPC ....................................................... 257/288
See application file for complete search history.

(56) References Cited

U.S. PATENT DOCUMENTS

2017/0162694 A1\*   6/2017   Basker ............ H01L 21/823814

\* cited by examiner

*Primary Examiner* — Theresa T Doan
(74) *Attorney, Agent, or Firm* — Alston & Bird LLP

(57) ABSTRACT

A field effect transistor structure includes a connection hole leading out a gate structure arranged on the formation area of one of a plurality of fins, and connection holes leading out a source electrode and a drain electrode, wherein the connection hole leading out the gate structure is located on formation areas of different fins; a gate cap layer formed at the top of the gate structure formed on the same fin body and adjacent to the connection holes leading out the source electrode and the drain electrode, wherein the gate cap layer protects the corresponding gate structure; buried holes formed on the source electrode and the drain electrode at both sides of the connection hole leading out the gate structure; a buried hole cap layer formed on the buried holes, and the buried hole cap layer protects the buried holes connecting the source and the drain electrode.

17 Claims, 5 Drawing Sheets

FIELD EFFECT TRANSISTOR, METHOD FOR MAKING THE SAME AND LAYOUT IN PROCESS OF FORMING THE SAME

CROSS-REFERENCES TO RELATED APPLICATIONS

This application claims priority to Chinese patent application No. CN 202010780888.0, filed on Aug. 6, 2020, and entitled "FIELD EFFECT TRANSISTOR, METHOD FOR MAKING THE SAME AND LAYOUT IN PROCESS OF FORMING THE SAME", the disclosure of which is incorporated herein by reference in entirety.

TECHNICAL FIELD

The present application relates to the field of semiconductor integrated circuits, in particular, to a field effect transistor.

BACKGROUND

Development of semiconductor technologies has demanded smaller critical dimension (CD) of devices. Recently three-dimensional devices emerged at the historic moment. The fin field-effect transistor (FinFET) device is a three-dimensional device. Compared with planar transistors, the FinFET has a three-dimensional channel structure. It exhibits better turn-on and turn-off current characteristics, and also improves the short channel effect (SCE). A FinFET usually includes fins, which are composed of nano-strips or nano-sheets structures formed on a semiconductor substrate. A gate structure wraps around top surfaces and side surfaces of the partial lengths of fins, so the interfaces of the fins and the gate structure form channels, that is, there are channels on the top surfaces and both sides of the fins. A source region is formed in the fins on one side of the gate structure and a drain region is formed in the fins on the other side of the gate structure.

In the case of 5 nm process node and beyond, the application of the FinFET adopts a nanowire or nanosheet gate-all-around (GAA) structure, which can further improve the SCE. The GAA structure includes wires formed on the semiconductor substrate. The channel region of a semiconductor device is formed in the wires. The metal gate (MG) covers the wires to form a gate structure. The source region is formed in the wires on one side of the gate structure and the drain region is formed in the wires on the other side of the gate structure. The GAA structure can effectively improve the SCE of the device.

FIG. 1 is a schematic layout diagram of a FinFET or a GAA field effect transistor in the existing techniques. Referring to FIG. 1, a plurality of fins or wires 110 is arranged in parallel, and a plurality of polysilicon gate rows 120 is arranged in parallel and intersects with the plurality of fins or wires 110; the overlapping areas between the polysilicon gate rows 120 and the fins or wires 110, i.e., the areas shown by the dashed boxes 140, are the areas of the gate structure of the field effect transistor, and the gate structure is a polysilicon gate structure or a metal gate structure; and the source region and the drain region are formed on the fins or wires 110 and located on both sides of the gate structure, and then the source region, the drain region and the gate structure are respectively led out through a first connection hole 131 for the source, a second connection hole 132 for the drain and a third connection hole 133 for the gate structure. Referring to FIG. 1, the source region is led out to a first metal wire 151 through the first connection hole 131, the drain region is led out to a second metal wire 152 through the second connection hole 132, and the gate structure is led out through the third connection hole 133. In the existing device, the third connection hole 133 for leading out the gate structure is located in the polysilicon gate row 120 outside the diffusion area. However this configuration increased the area of the field effect transistor (as shown by the dashed box 160 in FIG. 1), thus reduced the device density, which is contrary to the requirement for highly integrated semiconductor devices.

BRIEF SUMMARY OF THE DISCLOSURE

According to some embodiments in this application, a field effect transistor, comprising: a semiconductor substrate, a plurality of fins formed on the semiconductor substrate, wherein the plurality of fins is arranged in parallel, wherein the plurality of fins comprises wires made of a semiconductor; a plurality of polysilicon gate rows, wherein the plurality of polysilicon gate rows is arranged in parallel, wherein the plurality of polysilicon gate rows intersects with the plurality of fins; wherein gate structures of the field effect transistor are formed on overlapping areas between the plurality of fins and the plurality of polysilicon gate rows; a source electrode and a drain electrode, wherein the source electrode and the drain electrode are formed on each of the plurality of fins, and the source electrode is located on one side of one of the gate structure, and the drain electrode is located on the other side of said gate structures; and an interlayer dielectric layer that fills gaps between the plurality of polysilicon gate rows and the plurality of fins on the semiconductor substrate, wherein the interlayer dielectric layer covers the gate structure, a first connection hole, a second connection hole, a third connection hole, a first buried hole, and a second buried hole, wherein the second buried hole is formed in the interlayer dielectric layer, wherein the first connection hole and the second connection hole are located on the formation area of a first fin of the plurality of fins, so as to respectively lead out the source electrode and the drain electrode from the first fin; and wherein a gate cap layer is formed at a top of a first gate structure of the first fin and adjacent to the first connection hole and the second connection hole; wherein the third connection hole is disposed on the formation area of a second fin of the plurality of fins and is connected to a second gate structure of the second fin to lead out the second gate structure; wherein the first buried hole is formed on the source electrode on one side of the second gate structure, wherein the second buried hole is formed on the drain electrode on the other side of the second gate structure, and wherein a buried hole cap layer is formed on the first buried hole and the second buried hole.

In some examples, the third connection hole is arranged in a diffusion area.

In some examples, the first connection hole and the second connection hole for leading out the source electrode and the drain electrode respectively are spatially displaced away from the third connection hole for leading out the gate structure.

In some examples, a material of the semiconductor substrate and a material of the plurality of fins are the same.

In some examples, each of the gate structures comprises a metal gate structure, wherein the metal gate structure comprises a superimposed structure of a gate dielectric layer and a metal gate, wherein the gate cap layer is formed on the superimposed structure.

In some examples, the material of the gate cap layer is silicon nitride.

In some examples, the third connection hole is in contact with the metal gate of the gate structure to lead out the gate structure to form a gate of the field effect transistor.

In some examples, the plurality of fins comprises wires comprising a semiconductor, wherein the gate dielectric layer and the metal gate wrap the peripheral side of the wires to form a GAA gate structure, wherein the GAA gate structure, the source electrode and the drain electrode jointly form a GAA field effect transistor.

In some examples, the plurality of fins, the gate dielectric layer and the metal gate form a fin gate structure, wherein the fin gate structure, the source electrode and the drain electrode jointly form a fin field effect transistor.

In some examples, a material of the buried hole cap layer comprises silicon oxide.

In some examples, the third connection hole is formed on an overlapping area between the second fin and each of the plurality of polysilicon gate rows that intersects with the second fin, and wherein the third connection hole is located on the gate structure formed on the overlapping area, so that the third connection hole comes into contact with the gate structure formed on the overlapping area to lead out the gate structure.

According to some embodiments in this application, a layout of a field effect transistor, comprising: a plurality of fins arranged in parallel, wherein the plurality of fins comprises wires comprising a semiconductor material; a plurality of polysilicon gate rows, wherein the plurality of polysilicon gate rows is arranged in parallel, intersects with the plurality of fins, and wherein overlapping areas between the plurality of fins and the plurality of polysilicon gate rows form a gate structure of the field effect transistor; a source electrode and a drain electrode, wherein the source electrode and the drain electrode are formed on one of the plurality of fins, and are arranged one on each side of one of the gate structures; a first connection hole and a second connection hole, disposed on a formation area of a first fin of the plurality of fins, so as to lead out respectively the source and drain electrodes from the first fin; and a third connection hole, located on a formation area of a second fin of the plurality of fins and connected to a gate structure formed on the second fin of the plurality of fins, so as to lead out the gate structure.

In some examples, wherein the third connection hole is arranged in a diffusion area.

In some examples, the first connection hole and the second connection hole for leading out the source electrode and the drain electrode are spatially displaced from the third connection hole for leading out the gate structure.

In some examples, the third connection hole is formed on an overlapping area between the second fin and each of the plurality of polysilicon gate rows that intersects with the second fin, and is located on the gate structure formed on the overlapping area, so that the third connection hole comes into contact with the gate structure on the overlapping area to lead out the gate structure.

According to some embodiments in this application, a method for making the field effect transistor, comprising: S1, providing the semiconductor substrate, forming the plurality of fins on the semiconductor substrate, wherein the plurality of fins is arranged in parallel; S2, forming the plurality of polysilicon gate rows, wherein the plurality of polysilicon gate rows is arranged in parallel, wherein the plurality of polysilicon gate rows intersects with the plurality of fins, and wherein gate structures of the field effect transistor are formed on overlapping areas between the plurality of fins and the plurality of polysilicon gate rows; S3, forming the source electrode and the drain electrode on one of the plurality of fins, and wherein the source electrode is located on one side of one of the gate structures and the drain electrode is located on the other side of said gate structure; S4, forming the first interlayer dielectric layer and performing the planarization process on the first interlayer dielectric layer, wherein the first interlayer dielectric layer fills gaps between the plurality of polysilicon gate rows and the plurality of fins on the semiconductor substrate and covers the gate structure; S5, performing a photolithography process and an etching process to remove the top of each gate structure to form the groove at the top of the gate structure; S6, forming the first material layer and performing the planarization process, so that the first material layer fills the groove at the top of the gate structure to form the gate cap layer at the top of the gate structure; S7, performing a photolithography process and an etching process to the first interlayer dielectric layer to form through-holes on the source electrode and the drain electrode, filling a conductive material into the through-holes and performing the planarization process on the conductive material; S8, performing the photolithography process and an etching process to remove the top of the through-holes located on the source electrode and the drain electrode to form grooves at the top of the through-holes; S9, forming the second material layer and performing the planarization process on the second material layer, so that the second material layer fills the grooves at a top of the through-hole, wherein the first buried hole is formed by the through-hole formed on the source electrode, the second buried hole is formed by the through-hole formed on the drain electrode, and wherein the second material layer filling the grooves located at a top of the first buried hole and the second buried hole forms the buried hole cap layer; and S10, forming the second interlayer dielectric layer and performing the planarization process on the second interlayer dielectric layer so that the second interlayer dielectric layer and the first interlayer dielectric layer jointly form an interlayer dielectric layer; performing a photolithography process and an etching process until the buried hole cap layer on the formation area of the first fin of the plurality of fins is removed, the gate cap layer on the gate structure on the formation area of the second fin of the plurality of fins is removed, forming the conductive material layer, and preforming a planarization process on the conductive material layer, forming the first connection hole and the second connection hole on the formation area of the first fin of the plurality of fins, so as to lead out the source electrode and the drain electrode formed on the first fin respectively, forming the gate cap layer at a top of the first gate structure which is adjacent to the first connection hole and the second connection hole and formed on the first fin, forming the third connection hole located on the formation area of the second fin in the plurality of fins so as to connect to the second gate structure formed on the second fin to lead out the second gate structure, forming the first buried hole on the source electrode located on one side of the second gate structure, forming the second buried hole on the drain electrode located on the other side of the second gate structure, and forming the buried hole cap layer on the first buried hole and the second buried hole.

DETAILED DESCRIPTION OF THE DISCLOSURE

The technical solutions in the present disclosure will be described clearly and completely below in connection with the drawings, and it will be apparent that the embodiments described herein are merely a part of, not all the embodiments of the present disclosure. All other embodiments obtained by a person of ordinary skill in the art based on the embodiments of the present disclosure without creative efforts shall fall within the protection scope of the present disclosure.

It should be understood that the terms "first", "second", etc. in the claims of the present application and the specification are used to distinguish different objects, rather than to describe a specific order. The terms "including" and "comprising" used in the specification and claims of the present application indicate the existence of the described features, wholes, steps, operations, elements and/or components, but do not exclude the existence or addition of one or more other features, wholes, steps, operations, elements, components, and/or their collections.

Figure 2:
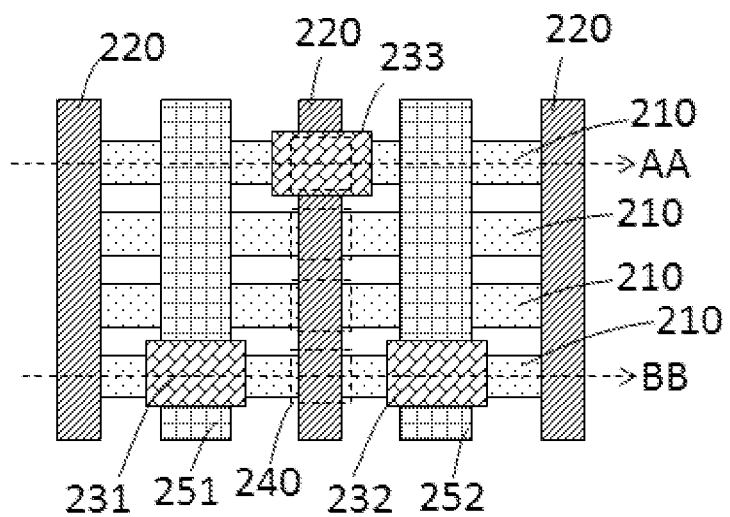
FIG. 2 is a schematic layout diagram of a FinFET or a GAA field effect transistor according to an embodiment of the present disclosure.
Figure 3:
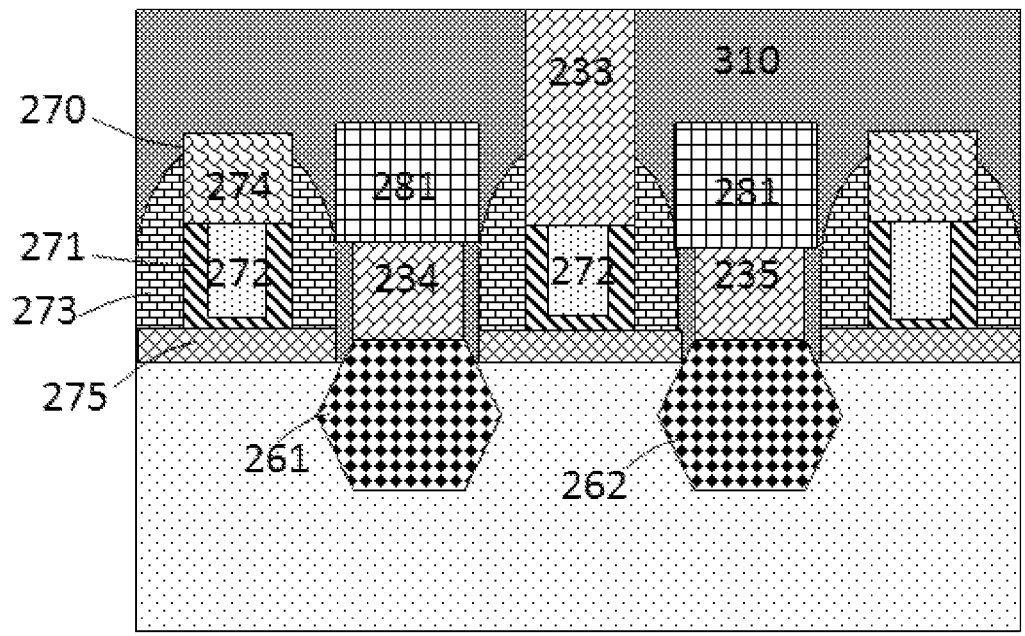
FIG. 3 is a schematic cross-sectional view of the field effect transistor cut along the line AA in FIG. 2 according to the embodiment of the present disclosure.
Figure 4:
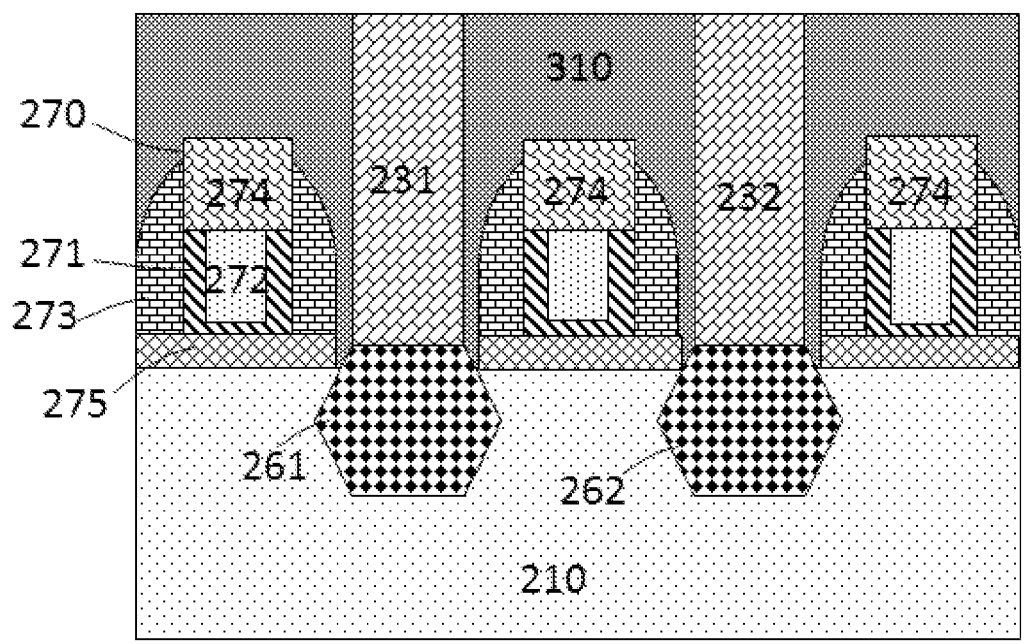
FIG. 4 is a schematic cross-sectional view of the field effect transistor cut along the line BB in FIG. 2 according to an embodiment of the present disclosure.

In an embodiment of the present disclosure, a field effect transistor is provided. Specifically, reference is made to FIG. 2 which is a schematic layout diagram of a FinFET or a GAA field effect transistor according to an embodiment of the present disclosure. Reference is also made to FIGS. 3 and 4, where FIG. 3 is a schematic cross-sectional view of the field effect transistor cut along the line AA in FIG. 2 according to an embodiment of the present disclosure, and FIG. 4 is a schematic cross-sectional view of the field effect transistor cut along the line BB in FIG. 2 according to an embodiment of the present disclosure. The field effect transistor according to the embodiment of the present disclosure includes the following structures:

A semiconductor substrate on which a plurality of fins 210 is formed, the plurality of fins 210 is arranged in parallel, these fins may have the form of wires comprising semiconductors, they will be referred to as fins in the following context, in some examples, wires of a semiconductor may be a replacement of the fins in the disclosure.

A plurality of polysilicon gate rows 220 is arranged in parallel and intersects with the plurality of fins 210. The gate structures 270 of the field effect transistor are formed on overlapping areas 240 between the plurality of fins 210 and the plurality of polysilicon gate rows 220.

A source electrode 261 and a drain electrode 262 are formed for each of the plurality of fins 210, and the source electrode 261 is located on one side of one of the gate structures 270, the drain electrode 262 is located on the other side of one of the gate structures 270.

An interlayer dielectric layer 310 fills gaps between the plurality of polysilicon gate rows 220 and the plurality of fins 210 on the semiconductor substrate and covers the gate structures 270. In addition, a first connection hole 231, a second connection hole 232, a third connection hole 233, a first buried hole 234, and a second buried hole 235 are formed in the interlayer dielectric layer 310, wherein the first connection hole 231 and the second connection hole 232 are located on the formation area of a first fin or semiconductor wire in the plurality of fins 210, so as to lead out the source electrode 261 and the drain electrode 262 formed on the first fin or semiconductor wire respectively. A gate cap layer 274 is formed at the top of a first gate structure which is adjacent to the first connection hole 231 and the second connection hole 232 and formed on the first fin or semiconductor wire; the third connection hole 233 is located on the formation area of a second fin or semiconductor wire in the plurality of fins 210 and is connected to a second gate structure formed on the second fin or semiconductor wire to lead out the second gate structure. The first buried hole 234 is formed on the source electrode 261 located on one side of the second gate structure, the second buried hole 235 is formed on the drain electrode 262 located on the other side of the second gate structure. A buried hole cap layer 281 is formed on the first buried hole 234 and the second buried hole 235.

Figure 1:
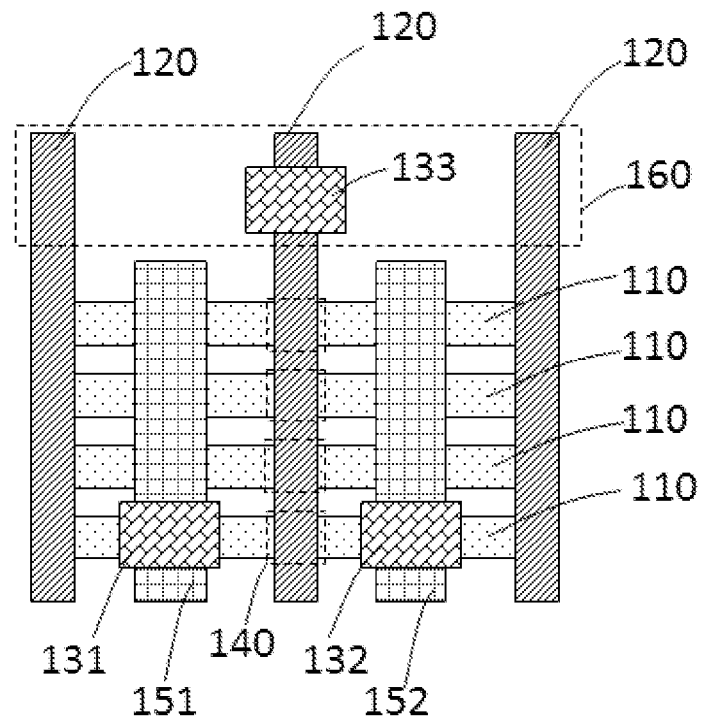
FIG. 1 is a schematic layout diagram of a FinFET or a GAA field effect transistor in the existing technique.

In this way, the third connection hole leading out the gate structure is arranged on the formation area of one fin or semiconductor wire among the plurality of fins, that is, the third connection hole leading out the gate structure is arranged in the diffusion area, instead of being arranged on a polysilicon gate row outside the diffusion area in the existing device shown in FIG. 1. Compared with the existing device in FIG. 1, the present disclosure does not need the areas shown by the dashed boxes in FIG. 1, thus the device density is increased and the integration level of the semiconductor device improved.

In addition, the first connection hole 231 and the second connection hole 232 for leading out the source electrode and the drain electrode are located on the formation area of the first fin and the third connection hole 233 for leading out the gate structure is located on the formation area of the second fin, that is, the first connection hole and the second connection hole for leading out the source electrode and the drain electrode are spatially displaced away from the third connection hole 233 for leading out the gate structure, thereby avoiding the short circuit between them and improving the reliability of the field effect transistor. A gate cap layer is formed at the top of the gate structure which is adjacent to the first connection hole and the second connection hole for leading out the source electrode and the drain electrode and formed on the same fin; the gate cap layer protects the corresponding gate structure, and prevents the gate structure from being short-connected with the first connection hole and the second connection hole for leading out the source electrode and the drain electrode. Moreover, buried holes are formed on the source electrode and the drain electrode on both sides of the third connecting hole for leading out the gate structure; a buried hole cap layer is formed on the buried holes, and the buried hole cap layer protects the buried holes connecting the source electrode and the drain electrode and prevents the third connection hole from being short-connected with the adjacent source and drain electrodes, which further improves the reliability of the field effect transistor.

In an embodiment of the present disclosure, the material of the semiconductor substrate and the material of the plurality of fins 210 are the same, such as silicon, that is, the plurality of fins 210 is made of the substrate or an epitaxial layer formed on the substrate. In an embodiment of the present disclosure, photolithography process and etching process are performed to the semiconductor substrate to form a plurality of fins, or at least one superposed layer including a silicon germanium epitaxial layer and a silicon epitaxial layer is formed on the surface of the semiconductor substrate. A plurality of fins are formed by photolithography process and etching process, and then a silicon germanium etching process is performed to remove the silicon germanium epitaxial layer in the fins to form semiconductor wires formed by the silicon epitaxial layer.

In an embodiment of the present disclosure, the plurality of fins 210 is arranged in parallel means that the plurality of fins 210 does not intersect with each other, but there may be a certain angle between them, or that the plurality of fins 210 are parallel to each other.

In an embodiment of the present disclosure, the plurality of polysilicon gate rows 220 is arranged in parallel means that the plurality of polysilicon gate rows 220 does not intersect with each other, but there may be a certain angle between them, or that the plurality of polysilicon gate rows 220 is parallel to each other.

In an embodiment of the present disclosure, the gate structure 270 is a metal gate structure, including a superposed structure of a gate dielectric layer 271 and a metal gate 272. According to some embodiments, a work function layer (not shown in the figure) may further be included between the gate dielectric layer 271 and the metal gate 272. In an embodiment of the present disclosure, sidewall spacers 273 are also formed on both sides of the superposed structure of the gate dielectric layer 271 and the metal gate 272. In an embodiment of the present invention, an interface layer 275 is also included between the gate structures 270 and the plurality of fins 210.

In an embodiment of the present disclosure, a gate cap layer 274 is formed on the superposed structure of the gate dielectric layer 271 and the metal gate 272. In an embodiment of the present invention, the material of the gate cap layer 274 is silicon nitride (SiN).

In an embodiment of the present disclosure, the third connection hole 233 is in contact with the metal gate 272 of the gate structure 270 to lead out the gate structure 270 to form the gate of the field effect transistor.

In an embodiment of the present disclosure, the plurality of fins 210 is wires made of a semiconductor, the gate dielectric layer 271 and the metal gate 272 wrap the peripheral side of the semiconductor wires to form a GAA gate structure; the GAA gate structure, the source electrode and the drain electrode jointly form a GAA field effect transistor; the plurality of fins 210 are fins, the gate dielectric layer 271, the metal gate 272, and the fins form a fin gate structure, and the fin gate structure, the source electrode and the drain electrode jointly form a fin field effect transistor (FinFET).

In an embodiment of the present disclosure, the material of the buried hole cap layer 281 is silicon oxide, such as silicon dioxide (SiO2).

In an embodiment of the present disclosure, the conductive material in the first connection hole 231, the second connection hole 232, the third connection hole 233, the first buried hole 234, and the second buried hole 235 is tungsten (W), cobalt (Co) or copper (Cu).

In an embodiment of the present disclosure, the third connection hole 233 is formed in the overlapping area between the second fin and the polysilicon gate row 220 that intersects with the second fin, and is located on the gate structure formed on the overlapping area, so that the third connection hole 233 comes into contact with the gate structure formed on the overlapping area to lead out the gate structure.

In an embodiment of the present disclosure, the first connection hole 231 leads the source electrode to a first metal wire 251, and the second connection hole 232 leads the drain electrode to a second metal wire 252.

In an embodiment of the present disclosure, the field effect transistor is a device of no more than 7 nm process node.

In an embodiment of the present disclosure, a layout of a field effect transistor is further provided. Referring to FIG. 2, the layout includes the following structures.

A plurality of fins 210, the plurality of fins 210 being arranged in parallel, these fins may have the form of wires comprising semiconductors, but they will be referred to as fins in the following context, in some examples, wires of a semiconductor may be a replacement of the fins in the disclosure.

A plurality of polysilicon gate rows 220, wherein the plurality of polysilicon gate rows 220 is arranged in parallel, the plurality of polysilicon gate rows 220 intersects with the plurality of fins 210, and overlapping areas 240 between the plurality of fins 210 and the plurality of polysilicon gate rows 220 form gate structures of the field effect transistor.

A source electrode and a drain electrode are formed on each of the plurality of fins 210, and are located on both sides of the one gate structure;

A first connection hole 231 and a second connection hole 232 are located on the formation area of a first fin of the plurality of fins 210, so as to lead out the source and drain electrodes formed on the first fin respectively; and a third connection hole 233, located on the formation area of the second fin in the plurality of fins 210 and connected to a gate structure formed on the second fin, so as to lead out the gate structure.

In this way, the third connection hole leading out the gate structure is arranged on the formation area of one fin among the plurality of fins, that is, the third connection hole leading out the gate structure is arranged in the diffusion area, instead of being arranged on a polysilicon gate row outside the diffusion area in the prior art in FIG. 1; compared with the prior art shown in FIG. 1, the present disclosure does not need the areas shown by the dashed boxes in FIG. 1, thus increasing the device density and improving the integration degree of the semiconductor device. In addition, the first connection hole and the second connection hole for leading out the source electrode and the drain electrode are located on the formation area of the first fin and the third connection hole for leading out the gate structure is located on the formation area of the second fin, that is, the first connection hole and the second connection hole for leading out the source electrode and the drain electrode are spatially displaced away from the third connection hole for leading out the gate structure, thus avoiding the short circuit between them and improving the reliability of the field effect transistor.

In an embodiment of the present disclosure, the third connection hole 233 is formed in the overlapping area between the second fin and the polysilicon gate row 220 that intersects with the second fin, and is located on the gate structure formed on the overlapping area, so that the third connection hole 233 comes into contact with the gate structure formed on the overlapping area to lead out the gate structure.

In an embodiment of the present disclosure, provided is a method for making a field effect transistor, including the following steps:

S1, providing a semiconductor substrate, forming a plurality of fins on the semiconductor substrate, while the plurality of fins is arranged in parallel;

S2, forming a plurality of polysilicon gate rows, wherein the plurality of polysilicon gate rows is arranged in parallel, the plurality of polysilicon gate rows intersects with the plurality of fins, and the gate structures of a field effect transistor are formed in overlapping areas between the plurality of fins and the plurality of polysilicon gate rows;

S3, forming a source electrode and a drain electrode on the plurality of fins, wherein the source electrode is located on one side of the gate structure and the drain electrode is located on the other side of the gate structure;

S4: forming a first interlayer dielectric layer and performing a planarization process, wherein the first interlayer dielectric layer fills gaps between the plurality of polysilicon gate rows and the plurality of fins on the semiconductor substrate and covers the gate structures;

S5: performing a photolithography process and an etching process to remove the top of each gate structure and replace with a groove at the top of the gate structure;

S6, forming a first material layer and performing a planarization process on the first material layer, so that the first material layer fills the groove at the top of each gate structure to leave a gate cap layer at the top of the gate structure;

S7, performing a photolithography process and an etching process to the first interlayer dielectric layer to form through-holes on the source electrode and the drain electrode, filling a conductive material to the through-holes, and performing a planarization process on the first interlayer dielectric layer;

S8, performing a photolithography process and an etching process to remove the top of the through-holes located on the source electrode and the drain electrode to form grooves at the top of the through-holes;

S9: forming a second material layer and performing a planarization process, so that the second material layer fills the grooves at the top of the through-holes, a first buried hole is formed by the through-hole formed on the source electrode, a second buried hole is formed by the through-hole formed on the drain electrode, and the second material layer filling the grooves located at the top of the first buried hole and the second buried hole forms a buried hole cap layer; and S10, forming a second interlayer dielectric layer and performing a planarization process so that the second interlayer dielectric layer and the first interlayer dielectric layer jointly form an interlayer dielectric layer, performing a photolithography process and an etching process until the buried hole cap layer on the formation area of the first fin in the plurality of fins is removed, the gate cap layer on a gate structure on the formation area of a second fin of the plurality of fins is removed, forming a conductive material layer, and performing a planarization process, forming a first connection hole and a second connection hole on the formation area of the first fin in the plurality of fins, so as to lead out the source electrode and the drain electrode formed on the first fin respectively, forming a gate cap layer at the top of a first gate structure which is adjacent to the first connection hole and the second connection hole and formed on the first fin, forming a third connection hole located on the formation area of the second fin in the plurality of fins so as to connect to a second gate structure formed on the second fin to lead out the second gate structure, forming the first buried hole on the source electrode located on one side of the second gate structure, forming the second buried hole on the drain electrode located on the other side of the second gate structure, and forming the buried hole cap layer on the first buried hole and the second buried hole.

According to some embodiments, referring to FIGS. 5-10 which are schematic cross-sectional views of a field effect transistor in the formation process along the line AA or the line BB in FIG. 2 according to an embodiment of the present disclosure and also referring to FIGS. 2-4, the method for making a field effect transistor includes the following steps.

S1, referring to FIG. 2, providing a semiconductor substrate, forming a plurality of fins 210 on the semiconductor substrate, and the plurality of fins 210 is arranged in parallel.

In an embodiment of the present disclosure, the material of the semiconductor substrate and the material of the plurality of fins 210 are the same, such as silicon, that is, the plurality of fins 210 is made of the substrate or an epitaxial layer formed on the substrate. In an embodiment of the present disclosure, photolithography process and etching process are performed to the semiconductor substrate to form a plurality of fins, or at least one superposed layer including a silicon germanium epitaxial layer and a silicon epitaxial layer is formed on the surface of the semiconductor substrate. A plurality of wire shaped fins are formed by photolithography process and etching process, and then a silicon germanium etching process is performed to remove the silicon germanium epitaxial layer in the fins to form the semiconductor wires from the silicon epitaxial layer.

In an embodiment of the present disclosure, the plurality of fins 210 is arranged in parallel, however there may be a small angle between the fins, but the fins 210 do not intersect with each other within the substrate.

Figure 5:
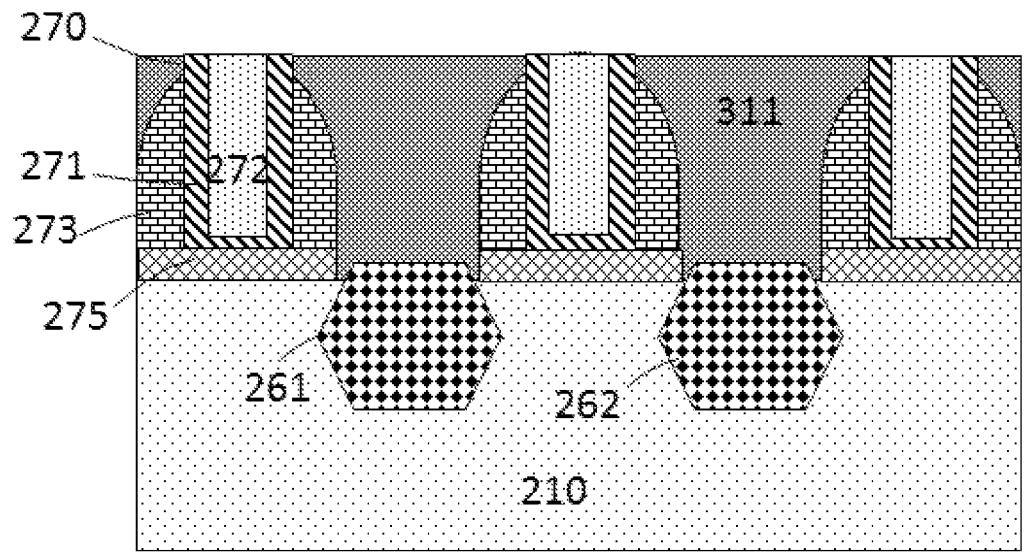
FIGS. 5-10 are respective schematic cross-sectional views of the field effect transistor in the formation process cut along the line AA or the line BB in FIG. 2 according to the embodiment of the present disclosure.

S2, referring to FIG. 2 and FIG. 5, forming a plurality of polysilicon gate rows 220, wherein the plurality of polysilicon gate rows 220 is arranged in parallel, the plurality of polysilicon gate rows 220 intersects with the plurality of fins 210, and gate structures 270 of the field effect transistor are formed on overlapping areas 240 between the plurality of fins 210 and the plurality of polysilicon gate rows 220.

In an embodiment of the present disclosure, the gate structure 270 is a metal gate structure, including a superposed structure of a gate dielectric layer 271 and a metal gate 272. According to some embodiments, a work function layer (not shown in the figure) may further be included between the gate dielectric layer 271 and the metal gate 272. In an embodiment of the present disclosure, sidewall spacers 273 are also formed on both sides of the superposed structure of the gate dielectric layer 271 and the metal gate 272. In an embodiment of the present invention, an interface layer 275 is also included between the gate structure 270 and the plurality of fins 210.

In an embodiment of the present disclosure, the plurality of polysilicon gate rows 220 is arranged in parallel, however there may be a small angle between the gate rows, but the rows 220 do not intersect with each other within the substrate.

S3, referring to FIG. 5, forming a source electrode 261 and a drain electrode 262 on the plurality of fins 210, and the source electrode 261 is located on one side of one of the gate structure 270 and the drain electrode 262 is located on the other side of the gate structure 270.

In an embodiment of the present disclosure, the plurality of fins 210 comprises wires made of a semiconductor; the gate dielectric layer 271 and the metal gate 272 wrap the peripheral side of the semiconductor wires to form a GAA gate structure; the GAA gate structure, the source electrode and the drain electrode jointly form a GAA field effect transistor; the gate dielectric layer 271, the metal gate 272, and the fins form a fin gate structure, and the fin gate structure, the source electrode and the drain electrode jointly form a fin field effect transistor (FinFET).

S4, referring to FIG. 5, forming a first interlayer dielectric layer 311 and performing a planarization process on the first interlayer dielectric layer 311; thus the first interlayer dielectric layer 311 fills gaps between the plurality of polysilicon gate rows 220 and the plurality of fins 210 on the semiconductor substrate, as the result the first interlayer dielectric layer 311 covers the gate structure 270.

Figure 6:
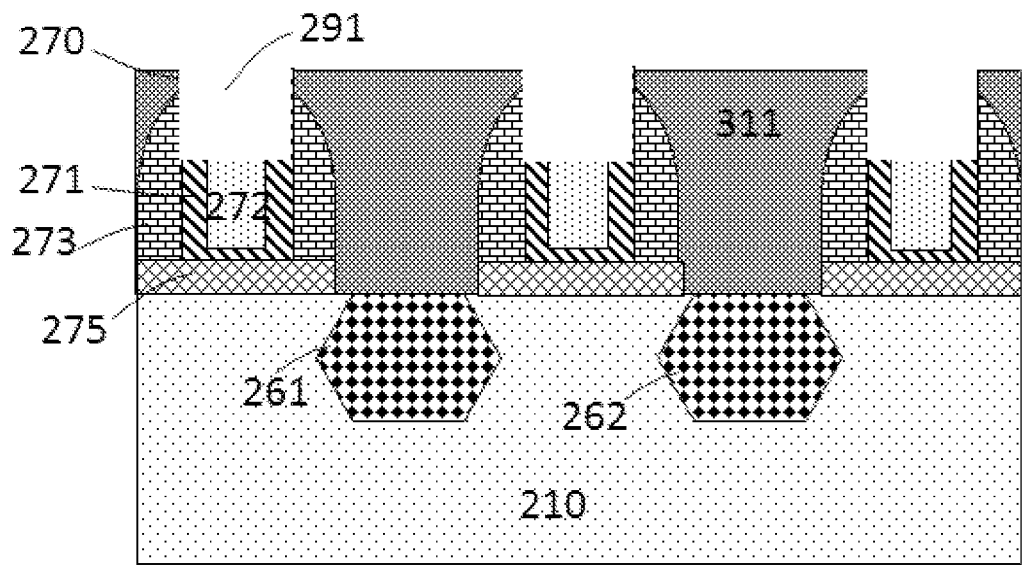

S5, referring to FIG. 6, performing a photolithography process and an etching process to remove the top of each gate structure and replace it with a groove 291 at the top of the gate structure.

Figure 7:
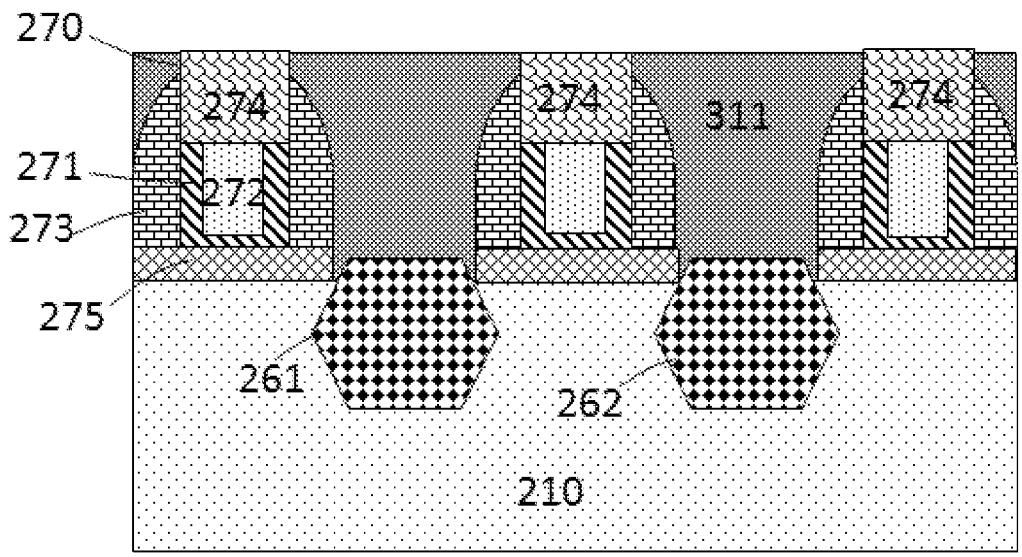

S6, referring to FIG. 7 and FIG. 6, forming a first material layer and performing a planarization process on the first material layer, so that the first material layer fills the groove 291 at the top of each gate structure to form a gate cap layer 274 at the top of the gate structure.

In an embodiment of the present disclosure, a gate cap layer 274 is formed on the superimposed structure of the gate dielectric layer 271 and the metal gate 272. In an embodiment of the present invention, the material of the gate cap layer 274 is silicon nitride (SiN), that is, the material of the first material layer is silicon nitride (SiN).

Figure 8:
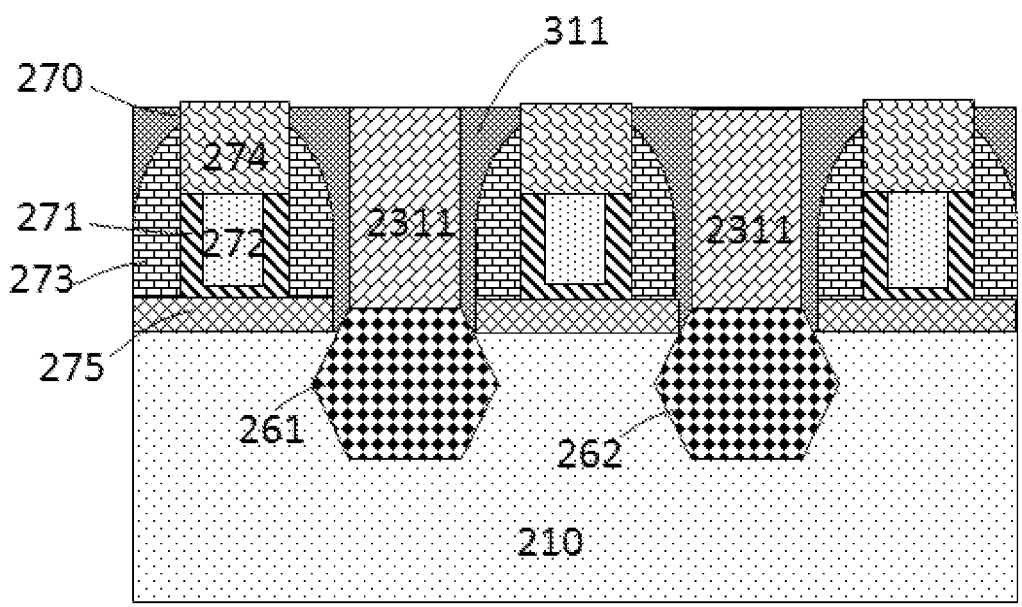

S7, referring to FIG. 8, performing a photolithography process and an etching process to the first interlayer dielectric layer 311 to form through-holes 2311 on the source electrode 261 and the drain electrode 262, then filling a conductive material to the through-holes and performing a planarization process on the conductive material layer.

Figure 9:
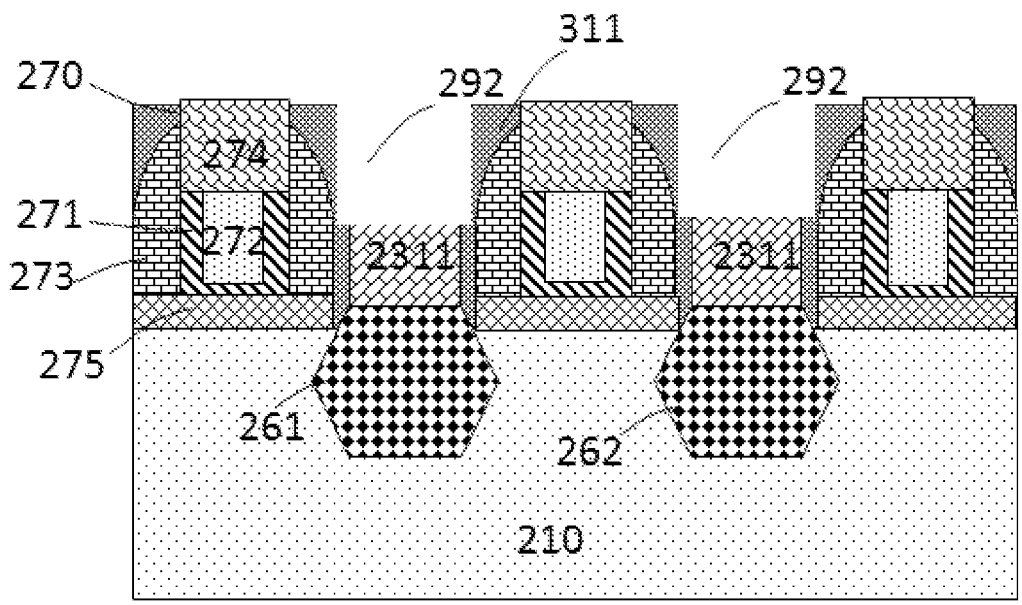

S8, referring to FIG. 9, performing a photolithography process and an etching process to remove the top of the through-holes 2311 located on the source electrode 261 and the drain electrode 262 to form grooves 292 at the top of the through-holes 2311.

Figure 10:
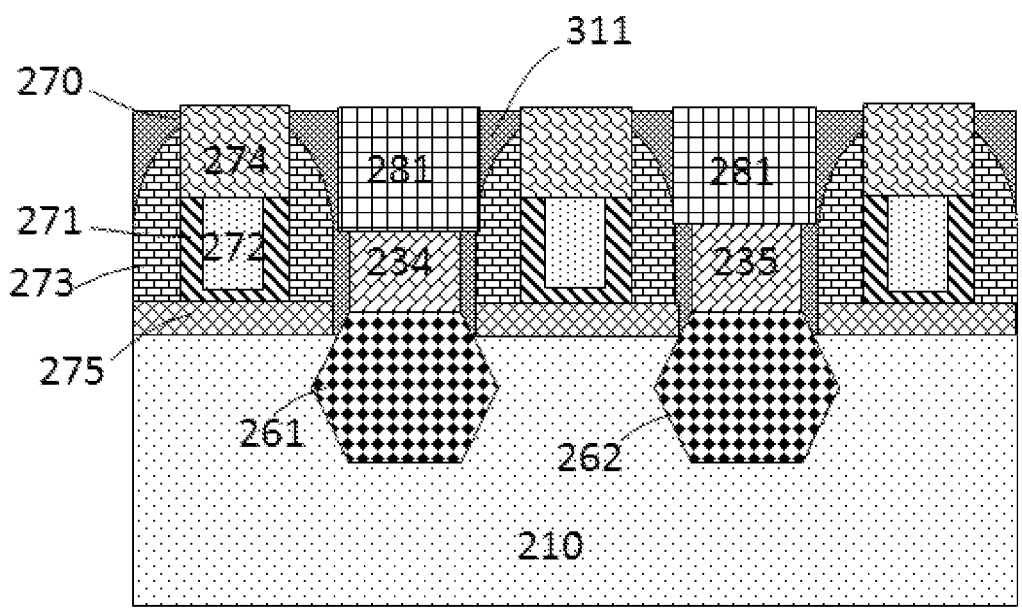

S9, referring to FIG. 10, forming a second material layer and performing a planarization process, so that the second material layer fills the grooves 292 at the top of the through-holes 2311, a first buried hole 234 is formed by the through-hole 2311 on the source electrode 261, a second buried hole 235 is formed by the through-hole 2311 on the drain electrode 262, and the second material layer, which fills the grooves located at the top of the first buried hole 234 and the second buried hole 235, forms a buried hole cap layer 281.

In an embodiment of the present disclosure, the material of the buried hole cap layer 281 is silicon oxide, such as silicon dioxide (SiO2).

S10, referring to FIGS. 3 and 4, forming a second interlayer dielectric layer and performing a planarization process on the second interlayer dielectric layer so that the second interlayer dielectric layer and the first interlayer dielectric layer jointly form an interlayer dielectric layer 310, performing a photolithography process and an etching process until the buried hole cap layer 281 on the formation area of the first fin 210 in the plurality of fins is removed, the gate cap layer 274 on a gate structure on the formation area of a second fin 210 of the plurality of fins is removed; forming a conductive material layer, and preforming a planarization process on the conductive material layer, a first connection hole 231 and a second connection hole 232 are formed on the formation area of the first fin in the plurality of fins, so as to lead out the source electrode 261 and the drain electrode 262 formed on the first fin 210 respectively, a gate cap layer 274 is formed at the top of a first gate structure which is adjacent to the first connection hole 231 and the second connection hole 232 and formed on the first fin, a third connection hole 233 is formed and located on the formation area of the second fin or semiconductor wire 210 in the plurality of fins so as to connect to a second gate structure formed on the second fin to lead out the second gate structure, the first buried hole 234 is formed on the source electrode 261 located on one side of the second gate structure, the second buried hole 235 is formed on the drain electrode 262 located on the other side of the second gate structure, and the buried hole cap layer 281 is formed on the first buried hole 234 and the second buried hole 235.

In an embodiment of the present disclosure, the material of the conductive material layer is tungsten (W), cobalt (Co) or copper (Cu).

In an embodiment of the present disclosure, the third connection hole 233 is formed on the overlapping area between the second fin and each polysilicon gate row 220 that intersects with the second fin, and is located on the gate structure formed on the overlapping area, so that the third connection hole 233 comes into contact with the gate structure formed on the overlapping area to lead out the gate structure. In an embodiment of the present disclosure, the third connection hole 233 is in contact with the metal gate 272 of the gate structure 270 to lead out the gate structure 270 to form the gate of the field effect transistor.

In an embodiment of the present disclosure, the first connection hole 231 leads the source electrode to the first metal wire 251, and the second connection hole 232 leads the drain electrode to the second metal wire 252.

In an embodiment of the present disclosure, the field effect transistor is a device with the 7 nm process node technology.

As described above, the third connection hole leading out the gate structure is arranged on the formation area of one fin among the plurality of fins, that is, the third connection hole leading out the gate structure is arranged in the diffusion area, instead of being arranged on a polysilicon gate row outside the diffusion area in the existing device as shown in FIG. 1; compared with FIG. 1, the present disclosure does not require the areas shown by the dashed boxes in FIG. 1, thus increasing the device density and improving the integration level of the semiconductor device. In addition, the first connection hole and the second connection hole for leading out the source electrode and the drain electrode are located on the formation area of the first fin and the third connection hole for leading out the gate structure is located on the formation area of the second fin, that is, the first connection hole and the second connection hole for leading out the source electrode and the drain electrode are spatially displaced from the third connection hole for leading out the gate structure, thus avoiding the short circuit between them and improving the reliability of the field effect transistor. A gate cap layer is formed at the top of the gate structure which is adjacent to the first connection hole and the second connection hole for leading out the source electrode and the drain electrode and formed on the same fin; the gate cap layer protects the corresponding gate structure, and prevents the gate structure from being short-circuited with the first connection hole and the second connection hole for leading out the source electrode and the drain electrode. Moreover, buried holes are formed on the source electrode and the drain electrode on both sides of the third connecting hole for leading out the gate structure; a buried hole cap layer is formed on the buried holes, and the buried hole cap layer protects the buried holes connecting the source electrode and the drain electrode and prevents the third connection hole from being short-circuited with the adjacent source and drain electrodes, which further improves the reliability of the field effect transistor.

Finally, it should be noted that the above embodiments are only used for illustrating rather than limiting the technical solutions of the present disclosure. Although the present disclosure is described in detail with reference to the foregoing embodiments, those of ordinary skill in the art should understand that they still can make modifications to the technical solutions disclosed in the foregoing embodiments or make equivalent substitutions to part or all of technical features thereof; and such modifications or substitutions should not cause the essence of the corresponding technical solutions to depart from the scope of the technical solutions of the embodiments of the present disclosure.

What is claimed is:

1. A field effect transistor, comprising:
    a semiconductor substrate, a plurality of fins formed on the semiconductor substrate, wherein the plurality of fins is arranged in parallel, wherein the plurality of fins comprises wires made of a semiconductor;
    a plurality of polysilicon gate rows, wherein the plurality of polysilicon gate rows is arranged in parallel, wherein the plurality of polysilicon gate rows intersects with the plurality of fins; wherein gate structures of the field effect transistor are formed on overlapping areas between the plurality of fins and the plurality of polysilicon gate rows;
    a source electrode and a drain electrode, wherein the source electrode and the drain electrode are formed on each of the plurality of fins, and the source electrode is located on one side of one of the gate structure, and the drain electrode is located on the other side of said gate structures; and
    an interlayer dielectric layer that fills gaps between the plurality of polysilicon gate rows and the plurality of fins on the semiconductor substrate, wherein the interlayer dielectric layer covers the gate structure, a first connection hole, a second connection hole, a third connection hole, a first buried hole, and a second buried hole, wherein the second buried hole is formed in the interlayer dielectric layer, wherein the first connection hole and the second connection hole are located on the formation area of a first fin of the plurality of fins, so as to respectively lead out the source electrode and the drain electrode from the first fin; and wherein a gate cap layer is formed at a top of a first gate structure of the first fin and adjacent to the first connection hole and the second connection hole; wherein the third connection hole is disposed on the formation area of a second fin of the plurality of fins and is connected to a second gate structure of the second fin to lead out the second gate structure; wherein the first buried hole is formed on the source electrode on one side of the second gate structure, wherein the second buried hole is formed on the drain electrode on the other side of the second gate structure, and wherein a buried hole cap layer is formed on the first buried hole and the second buried hole.

2. The field effect transistor according to claim 1, wherein the third connection hole is arranged in a diffusion area.

3. The field effect transistor according to claim 1, wherein the first connection hole and the second connection hole for leading out the source electrode and the drain electrode respectively are spatially displaced away from the third connection hole for leading out the gate structure.

4. The field effect transistor according to claim 1, wherein a material of the semiconductor substrate and a material of the plurality of fins are the same.

5. The field effect transistor according to claim 1, wherein each of the gate structures comprises a metal gate structure, wherein the metal gate structure comprises a superimposed structure of a gate dielectric layer and a metal gate, wherein the gate cap layer is formed on the superimposed structure.

6. The field effect transistor according to claim 1, wherein a material of the gate cap layer is silicon nitride.

7. The field effect transistor according to claim 5, wherein the third connection hole is in contact with the metal gate of the gate structure to lead out the gate structure to form a gate of the field effect transistor.

8. The field effect transistor according to claim 5, wherein the plurality of fins comprises wires comprising a semiconductor, wherein the gate dielectric layer and the metal gate wrap the peripheral side of the wires to form a GAA gate structure, wherein the GAA gate structure, the source electrode and the drain electrode jointly form a GAA field effect transistor.

9. The field effect transistor according to claim 5, wherein the plurality of fins, the gate dielectric layer and the metal gate form a fin gate structure, wherein the fin gate structure, the source electrode and the drain electrode jointly form a fin field effect transistor.

10. The field effect transistor according to claim 1, wherein a material of the buried hole cap layer comprises silicon oxide.

11. The field effect transistor according to claim 1, wherein the third connection hole is formed on an overlapping area between the second fin and each of the plurality of polysilicon gate rows that intersects with the second fin, and wherein the third connection hole is located on the gate structure formed on the overlapping area, so that the third connection hole comes into contact with the gate structure formed on the overlapping area to lead out the gate structure.

12. The field effect transistor according to claim 1, wherein the field effect transistor is a device of 7 nm or less process node.

13. An layout of a field effect transistor, comprising:
    a plurality of fins arranged in parallel, wherein the plurality of fins comprises wires comprising a semiconductor material;
    a plurality of polysilicon gate rows, wherein the plurality of polysilicon gate rows is arranged in parallel, intersects with the plurality of fins, and wherein overlapping areas between the plurality of fins and the plurality of polysilicon gate rows form a gate structure of the field effect transistor;
    a source electrode and a drain electrode, wherein the source electrode and the drain electrode are formed on one of the plurality of fins, and are arranged one on each side of one of the gate structures;
    a first connection hole and a second connection hole, disposed on a formation area of a first fin of the plurality of fins, so as to lead out respectively the source and drain electrodes from the first fin or; and
    a third connection hole, located on a formation area of a second fin of the plurality of fins and connected to a gate structure formed on the second fin of the plurality of fins, so as to lead out the gate structure.

14. The layout of the field effect transistor according to claim 13, wherein the third connection hole is arranged in a diffusion area.

15. The layout of the field effect transistor according to claim 13, wherein the first connection hole and the second connection hole for leading out the source electrode and the drain electrode are spatially displaced from the third connection hole for leading out the gate structure.

16. The layout of the field effect transistor according to claim 13, wherein the third connection hole is formed on an overlapping area between the second fin and each of the plurality of polysilicon gate rows that intersects with the second fin, and is located on the gate structure formed on the overlapping area, so that the third connection hole comes into contact with the gate structure on the overlapping area to lead out the gate structure.

17. A method for making the field effect transistor according to claim 1, comprising:
- S1, providing the semiconductor substrate, forming the plurality of fins on the semiconductor substrate, wherein the plurality of fins is arranged in parallel;
- S2, forming the plurality of polysilicon gate rows, wherein the plurality of polysilicon gate rows is arranged in parallel, wherein the plurality of polysilicon gate rows intersects with the plurality of fins, and wherein gate structures of the field effect transistor are formed on overlapping areas between the plurality of fins and the plurality of polysilicon gate rows;
- S3, forming the source electrode and the drain electrode on one of the plurality of fins, and wherein the source electrode is located on one side of one of the gate structures and the drain electrode is located on the other side of said gate structure;
- S4, forming the first interlayer dielectric layer and performing the planarization process on the first interlayer dielectric layer, wherein the first interlayer dielectric layer fills gaps between the plurality of polysilicon gate rows and the plurality of fins on the semiconductor substrate and covers the gate structure;
- S5, performing a photolithography process and an etching process to remove the top of each gate structure to form the groove at the top of the gate structure;
- S6, forming the first material layer and performing the planarization process, so that the first material layer fills the groove at the top of the gate structure to form the gate cap layer at the top of the gate structure;
- S7, performing a photolithography process and an etching process to the first interlayer dielectric layer to form through-holes on the source electrode and the drain electrode, filling a conductive material into the through-holes and performing the planarization process on the conductive material;
- S8, performing the photolithography process and an etching process to remove the top of the through-holes located on the source electrode and the drain electrode to form grooves at the top of the through-holes;
- S9, forming the second material layer and performing the planarization process on the second material layer, so that the second material layer fills the grooves at a top of the through-hole, wherein the first buried hole is formed by the through-hole formed on the source electrode, the second buried hole is formed by the through-hole formed on the drain electrode, and wherein the second material layer filling the grooves located at a top of the first buried hole and the second buried hole forms the buried hole cap layer; and
- S10, forming the second interlayer dielectric layer and performing the planarization process on the second interlayer dielectric layer so that the second interlayer dielectric layer and the first interlayer dielectric layer jointly form an interlayer dielectric layer; performing a photolithography process and an etching process until the buried hole cap layer on the formation area of the first fin of the plurality of fins is removed, the gate cap layer on the gate structure on the formation area of the second fin of the plurality of fins is removed, forming the conductive material layer, and preforming a planarization process on the conductive material layer, forming the first connection hole and the second connection hole on the formation area of the first fin of the plurality of fins, so as to lead out the source electrode and the drain electrode formed on the first fin respectively, forming the gate cap layer at a top of the first gate structure which is adjacent to the first connection hole and the second connection hole and formed on the first fin, forming the third connection hole located on the formation area of the second fin in the plurality of fins so as to connect to the second gate structure formed on the second fin to lead out the second gate structure, forming the first buried hole on the source electrode located on one side of the second gate structure, forming the second buried hole on the drain electrode located on the other side of the second gate structure, and forming the buried hole cap layer on the first buried hole and the second buried hole.

* * * * *